United States Patent
Parupalli et al.

(10) Patent No.: US 10,132,844 B2
(45) Date of Patent: Nov. 20, 2018

(54) CURRENT SENSE AMPLIFIER WITH COMMON MODE REJECTION

(71) Applicant: Cirrus Logic International Semiconductor Ltd., Edinburgh (GB)

(72) Inventors: Vamsikrishna Parupalli, Austin, TX (US); Itisha Tyagi, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 268 days.

(21) Appl. No.: 15/069,518

(22) Filed: Mar. 14, 2016

(65) Prior Publication Data
US 2017/0138990 A1    May 18, 2017

Related U.S. Application Data

(60) Provisional application No. 62/256,558, filed on Nov. 17, 2015.

(51) Int. Cl.
*G01R 17/16* (2006.01)
*G01R 19/10* (2006.01)
(Continued)

(52) U.S. Cl.
CPC ........... *G01R 19/10* (2013.01); *H03F 1/0205* (2013.01); *H03F 3/45* (2013.01); *H03F 3/45475* (2013.01); *H03F 3/45937* (2013.01); *G01R 15/14* (2013.01); *H03F 2200/171* (2013.01); *H03F 2200/462* (2013.01);
(Continued)

(58) Field of Classification Search
CPC .. H02J 50/12; H02J 50/50; H02J 5/005; H02J 50/40; H02J 2007/005; H02J 7/00; H02J 7/0047; G01R 15/14; G01R 19/0092; G01R 19/12; G01R 1/06; G01R 1/30; G01R 21/01; G01R 21/12; G01R 27/02; H01F 2017/0073; G01J 1/42; G01J 1/4257; G01J 1/44; G01J 3/30; G01J 3/453; G01J 5/20; G01J 5/22; G05F 1/561; G05F 3/02; G11C 5/145; H03B 2200/0088; H03B 2201/031; H03B 5/364
See application file for complete search history.

(56) References Cited

U.S. PATENT DOCUMENTS 6,816,100 B1    11/2004 Galton et al.
7,782,235 B1    8/2010 Velazquez
(Continued)

FOREIGN PATENT DOCUMENTS

JP    2014143537 A    8/2014
WO   2012109680 A2    8/2012
WO   2016039858 A1    3/2016

*Primary Examiner* — Vinh Nguyen
(74) *Attorney, Agent, or Firm* — Norton Rose Fulbright US LLP

(57) ABSTRACT

The overall performance of a current sense amplifier system may be improved by increasing the common mode rejection of the system. In particular, improved current sense amplifier systems of this disclosure may be configured to use a first ADC path to measure a current flowing through a device, a second ADC path to measure a common mode value, a memory element to store a calibration value, and a summer block to output a voltage proportional to the measured current through the device by correcting a voltage value output by the first ADC path based on the measured common mode value of the second ADC path and the stored calibration value.

26 Claims, 10 Drawing Sheets

(51) Int. Cl.
*H03F 3/45* (2006.01)
*H03F 1/02* (2006.01)
*H04R 3/00* (2006.01)
*G01R 15/14* (2006.01)

(52) U.S. Cl.
CPC .............. *H03F 2203/45048* (2013.01); *H03F 2203/45081* (2013.01); *H03F 2203/45101* (2013.01); *H04R 3/007* (2013.01)

(56) References Cited

U.S. PATENT DOCUMENTS

| | | |
|---|---|---|
| 9,160,356 B1 * | 10/2015 | Kearney ............... H03M 3/386 |
| 2009/0027125 A1 | 1/2009 | Tansley et al. |
| 2009/0096654 A1 | 4/2009 | Zhu et al. |
| 2009/0174479 A1 | 7/2009 | Yan et al. |
| 2012/0229264 A1 | 9/2012 | Bosch et al. |
| 2013/0265035 A1 | 10/2013 | Mazzarella et al. |
| 2014/0177850 A1 | 6/2014 | Quan et al. |
| 2014/0218011 A1 | 8/2014 | Nabhane et al. |
| 2015/0236662 A1 | 8/2015 | Ni et al. |

* cited by examiner

CURRENT SENSE AMPLIFIER WITH COMMON MODE REJECTION

CROSS REFERENCE TO RELATED APPLICATIONS

This application claims the benefit of U.S. Patent Application No. 62/256,558 filed on Nov. 17, 2015 and entitled "Current Sense Amplifier With High CM Rejection", which is hereby incorporated by reference. This application is related to subject matter disclosed in U.S. patent application Ser. No. 15/069,733 filed on Mar. 14, 2016 and entitled "Current Sense Amplifier With Enhanced Common Mode Input Range," which is hereby incorporated by reference.

FIELD OF THE DISCLOSURE

The instant disclosure relates to current sense amplifiers. More specifically, portions of this disclosure relate to enhanced common mode rejection and enhanced common mode input range in current sense amplifiers.

BACKGROUND

A current sense amplifier system may sense a current using a small sense resistor to generate a small sense voltage that is proportional to the sensed current. An amplifier of the current sense amplifier system is then used to amplify the small sense voltage. One such system is shown in FIG. 1. FIG. 1 is an example schematic block diagram illustrating a conventional current sense amplifier system according to the prior art. As illustrated in FIG. 1, a current being sensed by current sense amplifier system 100 corresponds to the current flowing through speaker 102. Current sense amplifier system 100 may also include an analog-to-digital converter (ADC) 104 to convert the analog sensed voltage signal to a digital sensed voltage signal suitable for digital post-processing.

Numerous drawbacks are associated with conventional current sense amplifier system of FIG. 1, and others. For example, a common mode voltage feed through may occur due to a mismatch between resistors 108A and 108B. The problem is exacerbated by the fact that the sense voltage is small compared to the common mode voltage, such that even a slight mismatch between resistors 108A and 108B can result in a common mode feed through voltage that is a significant percentage of the sense voltage. Another common problem is that the common mode input range of the amplifier may be narrow, limiting the range of operability of the current sense amplifier system.

Shortcomings mentioned here are only representative and are included simply to highlight that a need exists for improved electrical components, particularly for current sense amplifiers employed in consumer-level devices, such as mobile phones. Embodiments described herein address certain shortcomings but not necessarily each and every one described here or known in the art.

SUMMARY

The overall performance of a current sense amplifier system may be improved by increasing the common mode rejection of the system and/or by improving the common mode input range of the system. For example, a current sense amplifier system may be configured to use a first ADC path to measure a current flowing through a device and use a second ADC path to measure a common mode value. The system may further include a memory element to store a calibration value and a summer block to output a voltage proportional to the measured current through the device by correcting a voltage value output by the first ADC path based on the measured common mode value of the second ADC path and the stored calibration value. A current sense amplifier may also be configured to use a first signal path coupled to the amplifier and a first input terminal, wherein the first signal path is configured to measure the current through a device by generating a voltage proportional to the measured current, wherein the generated voltage comprises a small signal voltage with a large common mode voltage, and a second signal path coupled to the amplifier and the first input terminal, wherein the second signal path is configured to reduce the common mode of the generated voltage by level shifting the generated voltage to reduce the common mode voltage.

In particular, according to one embodiment, an apparatus for measuring a current through a device may include a first ADC path coupled to the device and configured to measure a current value; a second ADC path coupled to the device and configured to measure a common mode value; a memory element comprising a stored calibration value; and/or a summer block coupled to the first ADC path, the second ADC path, and the memory element, wherein the summer block is configured to output a voltage proportional to the measured current through the device by correcting a voltage value output by the first ADC path based, at least in part, on the measured common mode value of the second ADC path and the stored calibration value. According to some embodiments, a voltage across a sense resistor generated based, at least in part, on the measured current through the device comprises a small signal voltage having an amplitude smaller than the common mode value present on each node of the sense resistor.

In certain embodiments, the first ADC path includes an amplifier coupled to a sense resistor, wherein the sense resistor is in series with the device; and an ADC coupled to an output of the amplifier and configured to provide a digital value representative of the measured current value to the summer block. According to an embodiment, the first ADC further includes a first resistor coupled between the sense resistor and a first input node of the amplifier; and a second resistor having a second resistance value approximately equal to a first resistance value of the first resistor, wherein a modified common mode value generated by the multiplication of a voltage proportional to the measured common mode value and the stored calibration value is subtracted from an output of the first ADC path by the summer block to compensate for a mismatch between the first resistance value and the second resistance value.

In another embodiment, the second ADC path includes an amplifier block coupled to the device; and an ADC coupled to an output of the amplifier and configured to provide a digital value for the measured common mode to the summer block. According to an embodiment, the second ADC path further comprises a phase equalization filter coupled between the ADC and the summer block. In another embodiment, the second ADC path comprises at least one component configured to perform voltage monitoring within the apparatus. Additionally, in some embodiments, an ADC of the second ADC path is configured with a dynamic range that is smaller than a dynamic range of a second ADC of the first ADC path.

In certain embodiments, the device comprises a transducer and an output of the summer block is coupled to a speaker protection circuit. In other embodiments, the device comprises a transducer and an output of the summer block is coupled to a speaker linearization circuit. In addition, in some embodiments, the device comprises a haptic feedback device and an output of the summer block is coupled to a haptic control circuit.

According to another embodiment, a method for measuring a current through a device may include measuring, with a first ADC path, a current value for the current through the device; measuring, with a second ADC path, a common mode value for the device; receiving, from a memory element, a stored calibration value; and/or determining the current through the device by correcting a voltage proportional to the measured current value based, at least in part, on the measured common mode value and the stored calibration value. According to some embodiments, a voltage across a sense resistor generated based, at least in part, on the measured current through the device comprises a small signal voltage having an amplitude smaller than the common mode value present on each node of the sense resistor. In another embodiment, the method further comprises performing phase equalization in the second ADC path.

In some embodiments, the step of measuring the current value comprises: sensing a voltage proportional to a current through a sense resistor in series with the device with an amplifier; and converting an analog signal at an output of the amplifier to a digital signal for determining the current. In addition, according to an embodiment, the step of correcting the voltage proportional to the measured current value may include correcting for a resistor mismatch in the first ADC path. In another embodiment, the first ADC path has a dynamic range that is larger than a dynamic range of the second ADC path.

In certain embodiments, the method further comprises performing speaker protection based, at least in part, on the determined current through the device. In another embodiment, the method further comprises performing speaker linearization based, at least in part, on the determined current through the device. In yet another embodiment, the method also comprises providing haptic feedback based, at least in part, on the determined current through the device.

According to another embodiment, a mobile device may include a transducer; a controller integrated circuit (IC) coupled to the transducer, wherein the controller IC is configured to measure a current through the transducer, the controller IC comprising: a first ADC path coupled to the device and configured to measure a current value; a second ADC path coupled to the device and configured to measure a common mode value; a memory element comprising a stored calibration value; and/or a summer block coupled to the first ADC path, the second ADC path, and the memory element, wherein the summer block is configured to output a voltage proportional to the measured current through the device by correcting a voltage value output by the first ADC path based, at least in part, on the measured common mode value and the stored calibration value.

In certain embodiments, the first ADC path comprises an amplifier coupled to a sense resistor in series with the device; and an ADC coupled to an output of the amplifier and configured to provide a digital value to the summer block. According to an embodiment, the first ADC path further includes a first resistor coupled between the sense resistor and a first input node of the amplifier; and/or a second resistor having a second resistance value approximately equal to a first resistance value of the first resistor, wherein the second resistor is coupled between the sense resistor and a second input node of the amplifier, wherein a modified common mode value generated by the multiplication of a voltage proportional to the measured common mode value and the stored calibration value is subtracted from an output of the first ADC path by the summer block to compensate for a mismatch between the first resistance value and the second resistance value.

In another embodiment, an ADC of the second ADC path is configured with a dynamic range that is smaller than a dynamic range of an ADC of the first ADC path. In some embodiments, the controller IC is further configured to perform speaker protection based, at least in part, on the measured current through the transducer. In other embodiments, the controller IC is further configured to perform speaker linearization based, at least in part, on the measured current through the transducer.

According to one embodiment, an apparatus for measuring a current through a device includes an amplifier; a first signal path coupled to the amplifier and a first input terminal, wherein the first signal path is configured to measure the current through a device by generating a voltage proportional to the measured current, wherein the generated voltage comprises a small signal voltage with a large common mode voltage; and/or a second signal path coupled to the amplifier and the first input terminal, wherein the second signal path is configured to reduce the common mode of the generated voltage by level shifting the generated voltage to reduce the common mode voltage. The first signal path may include a first resistor coupled between the first input terminal and a first input of the amplifier; and a second resistor coupled between the first input terminal and a second input of the amplifier. The second signal path may include an inverter coupled to the first input terminal; a first resistor coupled between the inverter and a first input of the amplifier; and/or a second resistor coupled between the inverter and a second input of the amplifier. The device may include a transducer.

In certain embodiments, the amplifier, the first signal path, and the second signal path may comprise a first ADC path. In addition, the apparatus may also include a second ADC path configured to measure a common mode value and a memory element comprising a stored calibration value. The apparatus may also include, a first external resistor coupled between the first ADC path and the first input terminal; and/or a second external resistor coupled between the second ADC path and the device, wherein the first external resistor and the second external resistor are configured to increase linearity of the first ADC path and the second ADC path, respectively.

In some embodiments, the first signal path comprises a first passive R-C filter, and the second signal path comprises a second passive R-C filter, wherein the first passive R-C filter and the second passive R-C filter are configured to band limit the common mode voltage signal. The apparatus may also include a second amplifier coupled to the device; a third signal path from the device to the second amplifier, wherein the third signal path comprises a third passive R-C filter; and a fourth signal path from the first input terminal to the second amplifier, wherein the fourth signal path comprises a fourth passive R-C filter.

According to another embodiment, a method may include receiving, through a first signal path, a signal for measuring a current through a device, wherein the signal comprises a small signal with a large common mode; shifting, through a second signal path, a level of the signal without changing other characteristics of the signal such that the common mode of the signal is reduced; and/or sensing the current through the device. In some embodiments, shifting the level through the second signal path may include inverting the signal. In addition, correcting the voltage proportional to the sensed current value may include correcting for a resistor mismatch in the first ADC path. Moreover, the step of sensing the current through the device comprises sensing the current through a transducer.

According to an embodiment, receiving the signal through the first signal path may include filtering the signal with a first passive R-C filter. In addition, passive R-C filtering may also be applied in the second signal path with a second passive R-C filter. In some embodiments, the first passive R-C filter and the second passive R-C filter may be configured to band limit the common mode signal.

In some embodiments, receiving the signal and shifting the level of the signal may be performed in a first ADC path. The method may further include, monitoring a common mode value for the device with a second ADC path; receiving, from a memory element, a stored calibration value; and/or correcting a voltage proportional to the sensed current based, at least in part, on the measured common mode value and the stored calibration value. In some embodiments, the voltage being corrected may be a voltage generated based on the sensed current through the device and may include a small signal voltage in addition to a common mode voltage, with the small signal voltage having an amplitude smaller than the common mode value.

According to another embodiment, a mobile device may include a transducer and a controller integrated circuit (IC) coupled to the transducer, wherein the controller IC is configured to measure a current through the transducer. The controller IC may include an amplifier coupled to the transducer; a first signal path coupled to the amplifier and a first input terminal, wherein the first signal path is configured to measure the current through the transducer by generating a voltage proportional to the measured current, wherein the generated voltage comprises a small signal voltage with a large common mode voltage; and a second signal path coupled to the amplifier and the first input terminal, wherein the second signal path is configured to reduce the common mode of the generated voltage by level shifting the generated voltage to reduce the common mode voltage. The first signal path may include a first resistor coupled between the first input terminal and a first input of the amplifier; and/or a second resistor coupled between the first input terminal and a second input of the amplifier. The second signal path may include an inverter coupled to the first input terminal; a first resistor coupled between the inverter and a first input of the amplifier; and/or a second resistor coupled between the inverter and a second input of the amplifier. The device may include a transducer.

In certain embodiments, the amplifier, the first signal path, and the second signal path may comprise a first ADC path. In addition, the apparatus may also include a second ADC path configured to measure a common mode value and a memory element comprising a stored calibration value.

In some embodiments, the first signal path comprises a first passive R-C filter and the second signal path comprises a second passive R-C filter, wherein the first passive R-C filter and the second passive R-C filter are configured to band limit the common mode voltage signal. The apparatus may also include a second amplifier coupled to the transducer; a third signal path from the device to the second amplifier, wherein the third signal path comprises a third passive R-C filter; and/or a fourth signal path from the first input terminal to the second amplifier, wherein the fourth signal path comprises a fourth passive R-C filter.

The foregoing has outlined rather broadly certain features and technical advantages of embodiments of the present invention in order that the detailed description that follows may be better understood. Additional features and advantages will be described hereinafter that form the subject of the claims of the invention. It should be appreciated by those having ordinary skill in the art that the conception and specific embodiment disclosed may be readily utilized as a basis for modifying or designing other structures for carrying out the same or similar purposes. It should also be realized by those having ordinary skill in the art that such equivalent constructions do not depart from the spirit and scope of the invention as set forth in the appended claims. Additional features will be better understood from the following description when considered in connection with the accompanying figures. It is to be expressly understood, however, that each of the figures is provided for the purpose of illustration and description only and is not intended to limit the present invention.

BRIEF DESCRIPTION OF THE DRAWINGS

For a more complete understanding of the disclosed systems and methods, reference is now made to the following descriptions taken in conjunction with the accompanying drawings. In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

DETAILED DESCRIPTION

Figure 1:
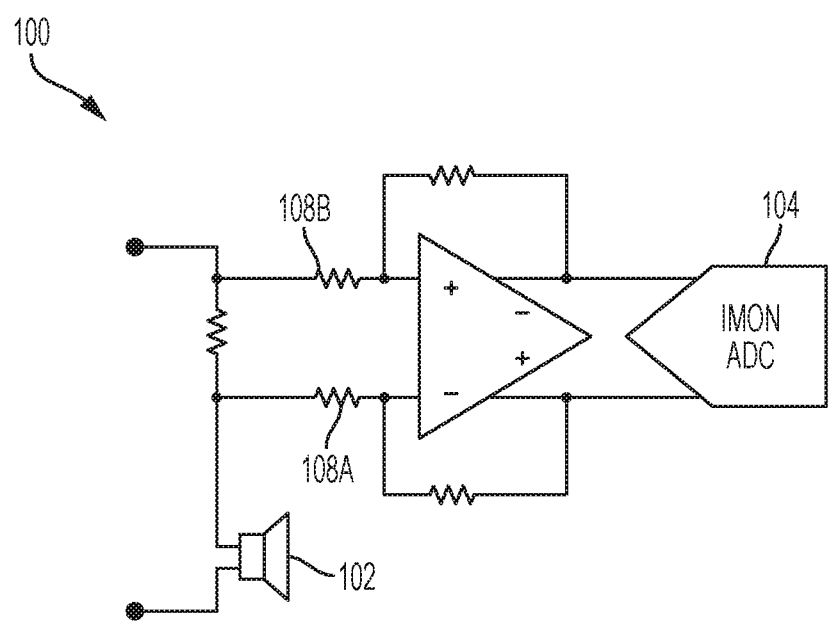
FIG. 1 is an example schematic block diagram illustrating a conventional current sense amplifier according to the prior art.
Figure 2:
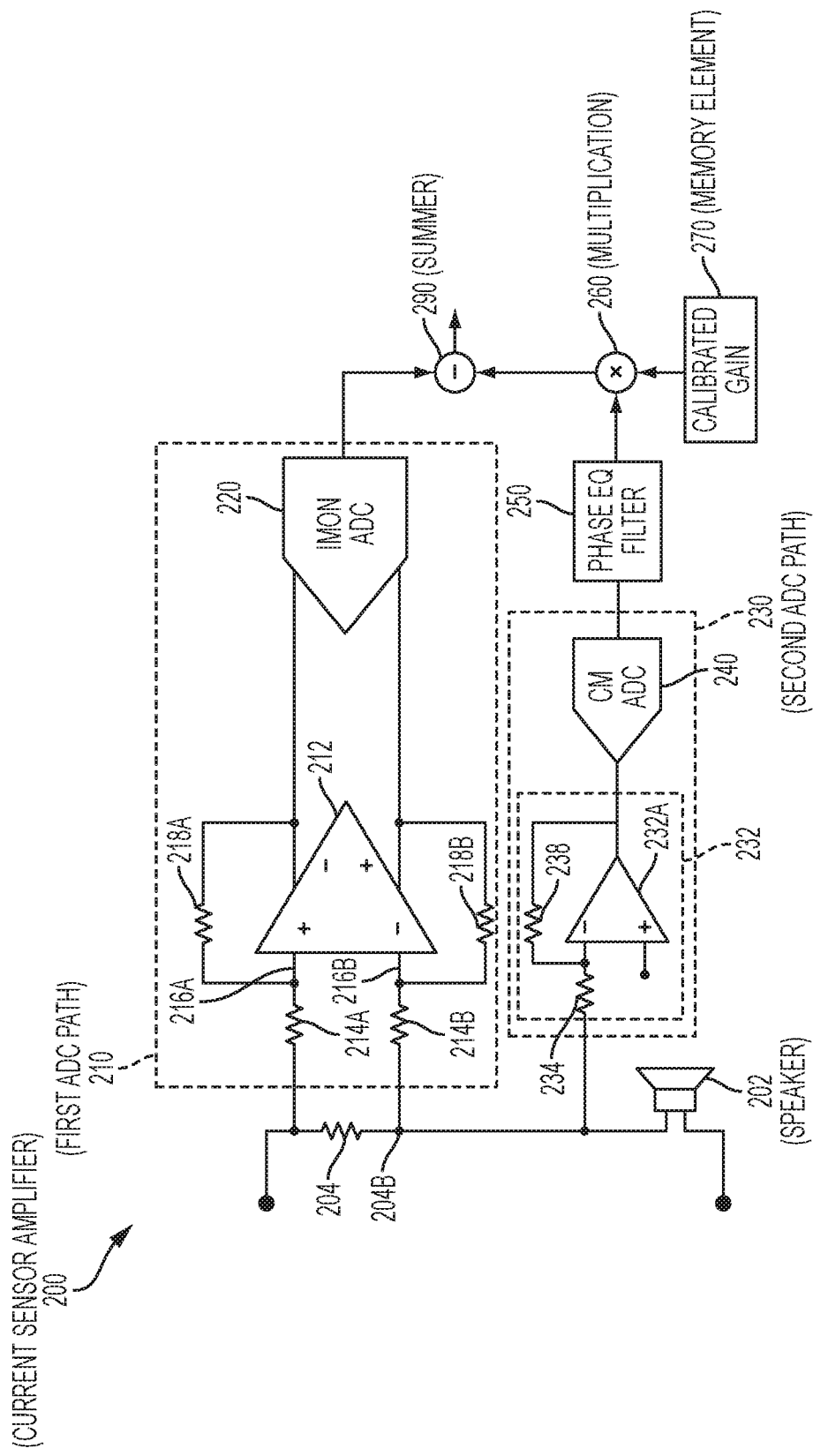
FIG. 2 is an example schematic block diagram illustrating a current sense amplifier with common mode rejection according to one embodiment of the disclosure.

FIG. 2 is an example schematic block diagram illustrating a current sense amplifier system with common mode rejection according to one embodiment of the disclosure. A current sense amplifier system 200 may sense the current flowing through device 202, such as a transducer or any other device through which current flows. In some embodiments, current sense amplifier system 200 may be implemented as a stand-alone circuit, as logic circuitry in a programmable device, or within a controller integrated circuit (IC). In addition, according to some embodiments, device 202 may be a transducer, such as an audio speaker or microphone.

The current sense amplifier system 200 includes a first ADC path 210 coupled to device 202 and configured to measure a current value. The first ADC path 210 includes an amplifier 212 coupled to a sense resistor 204. When first ADC path 210 is uncoupled from the nodes of sense resistor 204, the sense resistor 204 may be in series with device 202. According to some embodiments, sense resistor 204 may have a small resistance, such as a resistance less than 10 ohms or as small or smaller than 1 ohm or 0.5 ohm. Thus, the voltage across sense resistor 204 generated based on the measured current through device 202 may be a small signal voltage, in some configurations having an amplitude smaller than the common mode voltage present at the nodes of sense resistor 204.

The first ADC path 210 may be coupled to the nodes of sense resistor 204 to sense the voltage across sense resistor 204 and process the sensed voltage with amplifier 212 and an ADC. For example, first ADC path 210 may include a first resistor 214A coupled between sense resistor 204 and a first input node 216A of amplifier 212 and a second resistor 214B coupled between sense resistor 204 and a second input node 216B of amplifier 212. The second resistor 214B may have a second resistance value approximately equal to the first resistor 214A.

The first ADC path 210 may also include additional resistors to perform various operations on the sensed voltage of sense resistor 204. For example, first ADC path 210 includes additional resistors 218A and 218B to implement a gain function. The combination of amplifier 212, resistors 214A and 214B, and resistors 218A and 218B may amplify the voltage sensed across sense resistor 204 to output to ADC 220 an amplified version of the voltage sensed across sense resistor 204. One of skill in the art will readily recognize that the particular gain function illustrated in FIG. 2 using amplifier 212, resistors 214A and 214B, and resistors 218A and 218B is but one embodiment of an amplifying stage which may be used in first ADC path 210. For example, more or less resistors may be used in collaboration with amplifier 212 to perform other gain functions in first ADC path 210.

First ADC path 210 also includes ADC 220, which may be coupled to an output of amplifier 212 and configured to provide a digital value to summer block 290. The digital value output by ADC 220 to summer block 290 may be representative of the voltage across sense resistor 204 generated based on the measured current value.

In some embodiments, the voltage value presented to ADC 220 by amplifier 212 may also include a common mode feed through voltage $\Delta V cm$. For example, $\Delta V cm$ may appear at the output of amplifier 212 as a result of mismatch between resistors 214A and 214B or between resistors 218A and 218B. Thus, the voltage output by amplifier 212 to ADC 220 may be defined as Vout+$\Delta V cm$, where Vout is the voltage output by amplifier 212 that is proportional to the current sensed by sense resistor 204 and $\Delta V cm$ is the common mode voltage fed through due to mismatches in first ADC path 210. Accordingly, the digital voltage value output by ADC 220, which is also the digital voltage value output by first ADC path 210, may be defined as Vout+$\Delta V cm$.

Current sense amplifier system 200 may include a second ADC path 230 to reduce the amount of $\Delta V cm$ propagated from ADC 220 to subsequent processing blocks. By reducing the amount of $\Delta V cm$ propagated to subsequent processing blocks, the digital voltage signal propagated to subsequent processing blocks may more accurately represent an amplified version of the voltage sensed across sense resistor 204.

The second ADC path 230 may be coupled to device 202 and configured to measure a common mode value. The second ADC path 230 may include at least one component configured to perform voltage monitoring. In particular, second ADC path 230 may include an amplifier block 232 coupled to device 202. In some embodiments, amplifier block 232 need not perform amplification, but may instead perform attenuation, which may be considered a kind of amplification. For example, amplifier block 232 may be implemented with a single amplifier 232A and two resistors 234 and 238. The configuration of resistors 234 and 238 may be modified to perform amplification or attenuation or neither. In other words, amplification block 232 may be configured to output a voltage signal representative of the common mode voltage signal detected at an input of block 232 with or without amplifying or attenuating the signal. One of skill in the art will readily recognize that the implementation of amplification, attenuation, or voltage following illustrated in amplifier block 232 of FIG. 2 is but one configuration of an amplifying, attenuating, or voltage following function which may be used in second ADC path 230. Other configurations may be used to implement amplification, attenuation, or voltage following with amplifier block 232 of second ADC path 230.

The second ADC path 230 may also include an ADC 240, which may be coupled to an output of amplifier block 232 and configured to provide a digital value for the measured common mode voltage to summer block 290. In some embodiments, ADC 240 of second path 230 may be configured with a dynamic range that is smaller than a dynamic range of ADC 220 of first ADC path 210. The second ADC path 230 may also include a phase equalization filter 250 coupled between ADC 240 and summer block 290. When present, the phase equalization filter 250 may be used to time shift the common mode voltage signal output by ADC 240, thus creating a desired phase delay in the signal which implements the desired phase equalization.

Figure 4A:
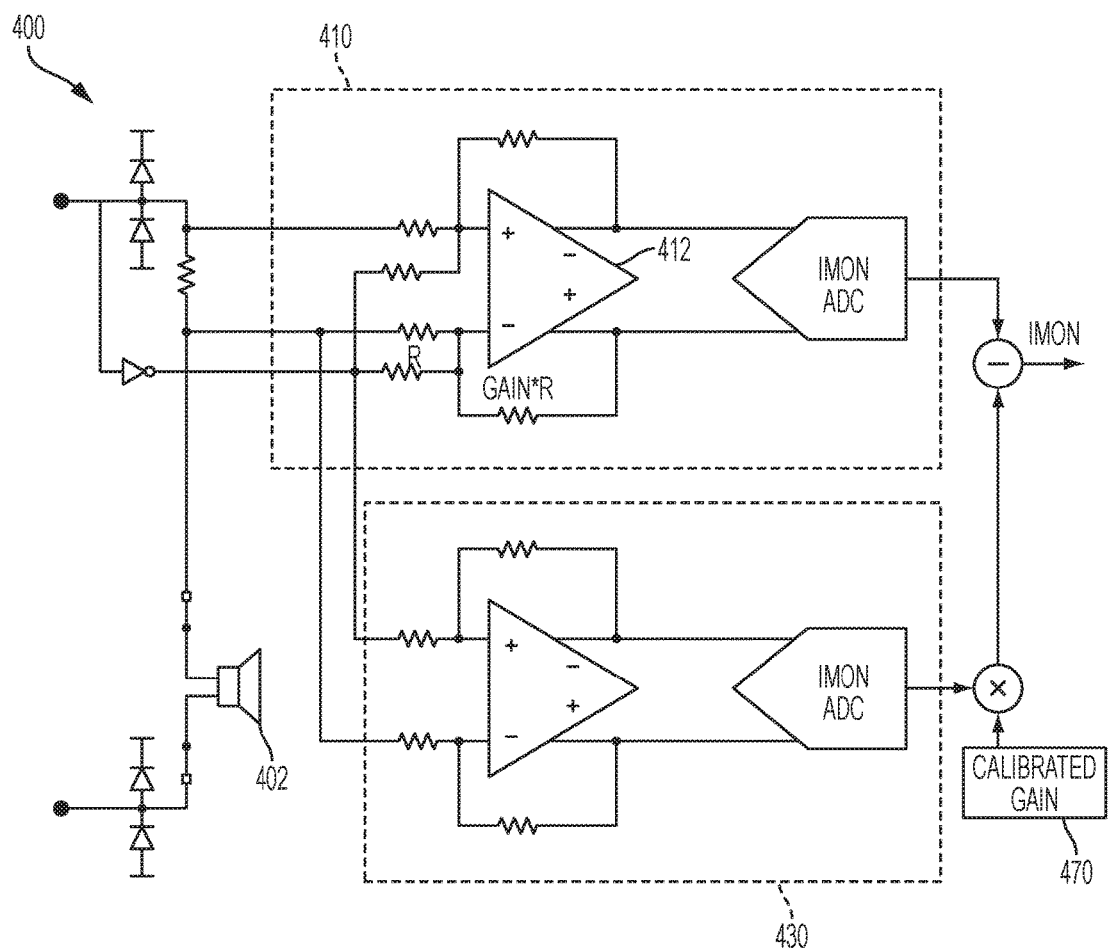
FIG. 4A is an example schematic block diagram illustrating a current sense amplifier with common mode rejection and enhanced wide common mode input range according to one embodiment of the disclosure.
Figure 4B:
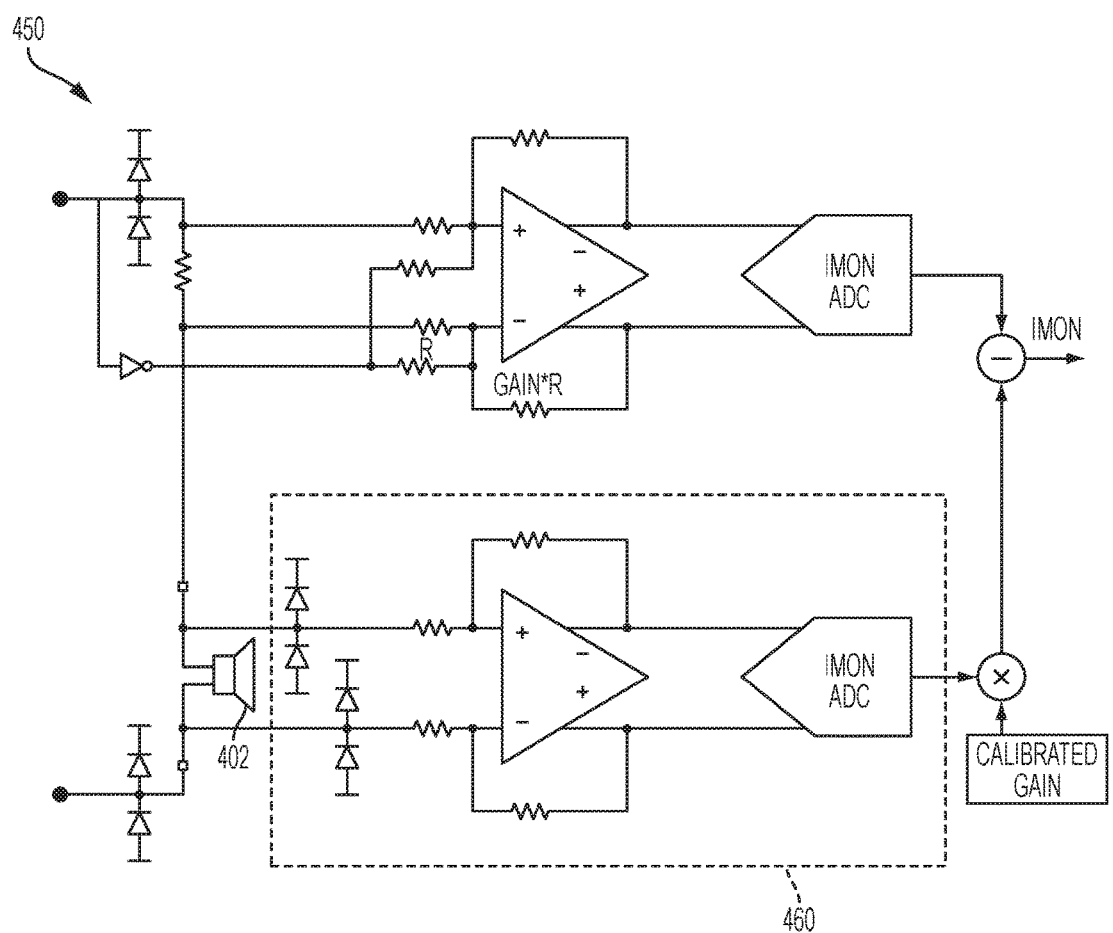
FIG. 4B is another example schematic block diagram illustrating a current sense amplifier with common mode rejection and enhanced wide common mode input range according to one embodiment of the disclosure.

Second ADC path 230 may also include a multiplication block 260 coupled between phase equalization filter 250 and summer block 290. In addition, second ADC path 230 may include a memory element 270, which may include a stored common mode calibration value. A common mode voltage signal that is approximately equal to $\Delta V cm$ may thus be generated based on the multiplication block 260 and the common mode calibration value stored in memory element 270. For example, an output of phase equalization filter 250 may be transferred to multiplication block 260. The output signal applied to multiplication block 260 from phase equalization filter 250 may be a signal representative of the common mode voltage detected by second ADC path 230 from node 204B. In other words, the signal applied to multiplication block 260 from phase equalization filter 250 may be the signal that results after the common mode voltage detected by second ADC path 230 from node 204B has been processed by second ADC path 230 and phase equalization filter 250. However, in some embodiments, the signal applied to multiplication block 260 may be the output from ADC 240. That is, the current sense amplifier system may not include a phase equalization filter 250 such that the signal applied to multiplication block 260 may be the output from ADC 240. For example, FIGS. 4A and 4B provide illustrations of other embodiments of current sense amplifier system 200 in which a phase equalization filter is not utilized. Regardless of whether the signal applied to multiplication block 260 is applied directly from ADC 240 or via phase equalization filter 250, the signal may be representative of the common mode voltage detected at node 204B. Thus, the signal applied to multiplication block 260 may be defined as Vcm, a common mode voltage signal proportional to or approximately equal to the common mode voltage detected at node 204B.

In multiplication block 260, the signal applied to multiplication block 260 may be multiplied by the calibration value stored in memory element 270 to generate a modified common mode voltage value. For example, with the calibration value stored in memory element 270 represented as δ, the output of multiplication block 260 may be represented at δVcm because, as noted above, the signal applied to multiplication block 260 may be defined as Vcm. In some embodiments, the calibration value δ stored in memory element 270 may be set to a value approximately equal to Δ so that the common mode voltage signal δVcm output by multiplication block 260 may be approximately equal in value to the common mode feed through voltage signal ΔVcm output by first ADC path 210. In some embodiments, calibration value δ stored in memory element 270 may be determined based on simulations of current sense amplifier system 200 and/or experimentation or testing performed on current sense amplifier system 200 or other systems having similar properties and functionality as current sense amplifier system 200. After determining a calibration value δ, based on simulations and/or experimentation, that closely approximates the actual percentage Δ of common mode voltage fed through in first ADC path 210, the determined calibration value δ may be stored in memory element 270 so that the calibration value δ may be applied to multiplication block 260 from memory element 270 to generate a modified common mode voltage signal δVcm that is approximately equal to ΔVcm.

Current sense amplifier system 200 may include summer block 290 to allow the reduction of the feed through common mode voltage from the voltage signal Vout+ΔVcm output by first ADC path 210. The summer block 290 may be coupled to first ADC path 210, second ADC path 230, and memory element 270. To implement the enhanced common mode rejection functionality of current sense amplifier system 200, summer block 290 may be configured to output a voltage proportional to the measured current through the device by correcting a voltage value output by the first ADC path based, at least in part, on the measured common mode value of the second ADC path and the stored calibration value. For example, summer block 290 may receive as inputs the voltage signal Vout+ΔVcm output by first ADC path 210 and the voltage signal δVcm output by multiplication block 260. Summer block 290 may subtract δVcm from Vout+ΔVcm so that the output of summer block 290 may be defined as Vout+ΔVcm−δVcm. When δ accurately approximates Δ, then the output of summer block 290 may be reduced to simply Vout, a voltage signal that is primarily a voltage proportional to the current measured through sense resistor 204. Thus, in some embodiments, summer block 290 may be configured to subtract the modified common mode voltage value δVcm from the output Vout+ΔVcm of first ADC path 210 to compensate for mismatches in first ADC path 210, such as a mismatch between first resistor 214A and second resistor 214B.

The monitored current output produced by the summer block 290 may be fed to other systems for processing and performing of additional functions. For example, when the device 202 is a transducer, an output of summer block 290 may be coupled to a speaker protection circuit, a speaker linearization circuit. In another example, when the device 202 is a haptic feedback device, an output of summer block 290 may be coupled to a haptic control circuit.

Figure 3:
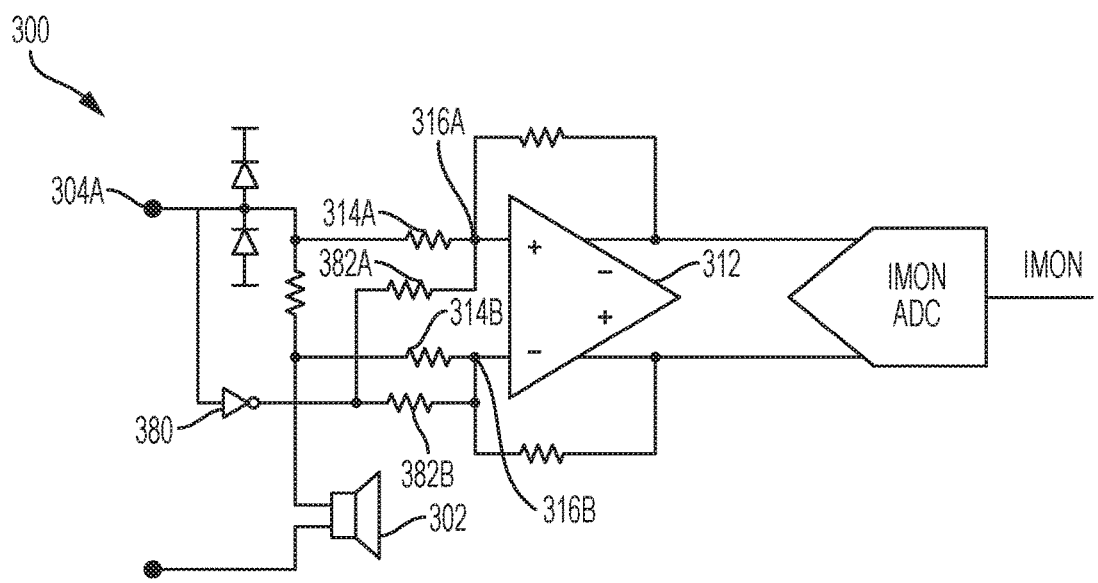
FIG. 3 is an example schematic block diagram illustrating a current sense amplifier with enhanced wide common mode input range according to one embodiment of the disclosure.

FIG. 3 is an example schematic block diagram illustrating a current sense amplifier with enhanced wide common mode input range according to one embodiment of the disclosure. A current sense amplifier system 300 includes an amplifier 312 and a first signal path coupled to amplifier 312 and a first input terminal 304A. The first signal path may be configured to measure the current through device 302 by generating a voltage proportional to the measured current. In addition, in another embodiment, the generated voltage may include a small signal voltage and a large common mode voltage. The first signal path may include a first resistor 314A coupled between first input terminal 304A and a first input 316A of amplifier 312. The first signal path may also include a second resistor 314B coupled between first input terminal 304A and a second input 316B of amplifier 312.

As illustrated in the embodiment of FIG. 3, current sense amplifier system 300 may also include a second signal path coupled to amplifier 312 and to first input terminal 304A. The second signal path may be configured to reduce the common mode of the generated voltage by level shifting the generated voltage to reduce the common mode of the voltage. For example, the second signal path may include an inverter 380 coupled to first input terminal 304A, a first resistor 382A coupled between inverter 380 and a first input 316A of the amplifier 312, and a second resistor 382B coupled between inverter 380 and a second input 316B of the amplifier 312. In operation, inverter 380 and resistors 382 apply a common mode voltage signal to the inputs 316 of amplifier 312 to be added with the common mode voltage signal applied to the same inputs 316 of amplifier 312 via the first signal path. However, because the common mode signal applied via the second signal path is an inverse of the signal present at input terminal 304A, the summing of the voltages at the inputs 316 of amplifier 312 amounts to a reduction of the common mode signal applied via the first signal path. By adding, through the second signal path, a common mode signal to the inputs 316 of amplifier 312 that is an inverse of the common mode signal applied to the inputs 316 of amplifier 312 from the first signal path, the input range of amplifier 312 is prevented from reaching extreme values outside the operational range of amplifier 312, thus allowing the input common mode voltage range to have a wider range than would be present without the inclusion of the second signal path.

FIG. 4A is an example schematic block diagram illustrating a current sense amplifier system with common mode rejection and enhanced wide common mode input range according to one embodiment of the disclosure. A current sense amplifier system 400 uses a second ADC path 430 to implement enhanced common mode rejection. In addition, current sense amplifier system 400 also utilizes a second signal path to improve the common mode input range. One difference between current sense amplifier system 200 and current sense amplifier system 400 is that a differential amplifier is used in second ADC path 430 to detect the common mode voltage instead of a single-ended amplifier as used in second ADC path 230. Another difference is that current sense amplifier system 400 does not include a phase equalization filter. In some embodiments, current sense amplifier system 400 may also be implemented with a phase equalization filter similar to current sense amplifier system 200. In the current sense amplifier system 400, amplifier 412, the first signal path, and the second signal path may be a first ADC path 410, similar to first ADC path 210 of system 200, and second ADC path 430 may be configured to measure a common mode value, similar to second ADC path 230. In addition, system 400 also includes a memory element 470 that includes a stored calibration value.

FIG. 4B is another example schematic block diagram illustrating a current sense amplifier system with common mode rejection and enhanced wide common mode input range according to one embodiment of the disclosure. Current sense amplifier system 450 is similar to current sense amplifier system 400 of FIG. 4A, but one difference includes a configuration for the differential inputs of second ADC path 460 of system 450 to couple to two different terminals of device 402, whereas the differential inputs of second ADC path 430 of system 400 couple to the same terminal of device 402.

Figure 5:
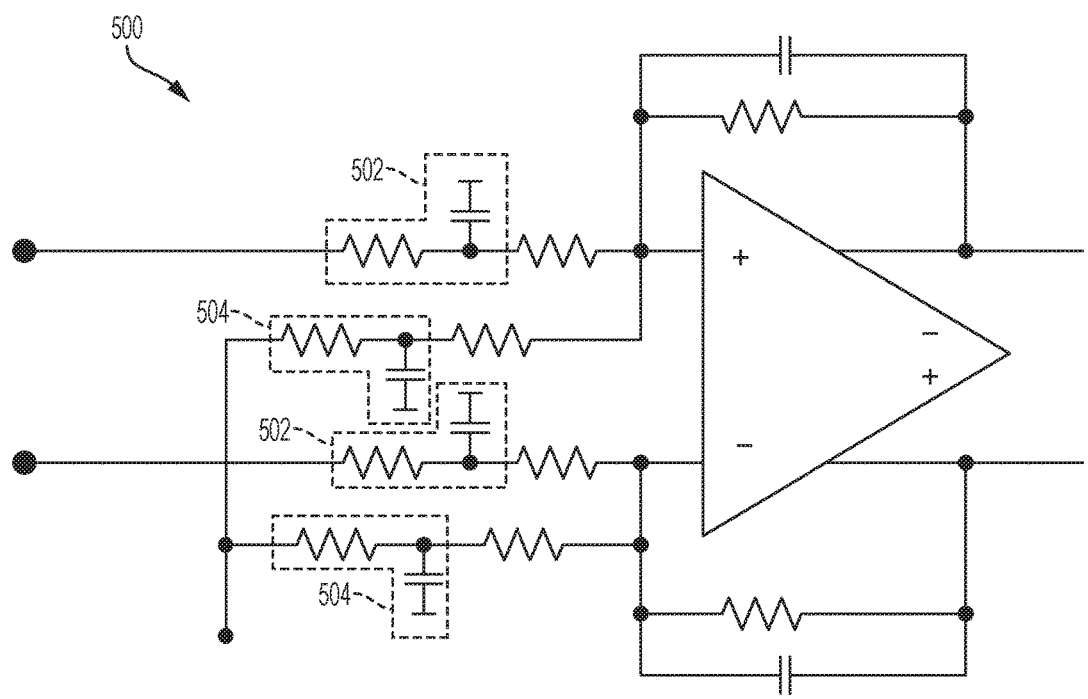
FIG. 5 is an example schematic block diagram illustrating passive resistor-capacitor (R-C) filtering in a current sense amplifier according to one embodiment of the disclosure.

FIG. 5 is an example schematic block diagram illustrating passive R-C filtering in a current sense amplifier system according to one embodiment of the disclosure. Passive R-C filtering may be implemented at an input stage of an amplifier included in a current sense amplifier system, such as the current sense amplifier systems described above with reference to FIG. 2, FIG. 3, FIG. 4A, and FIG. 4B. For example, amplifier stage 500 includes a first signal path and a second signal path similar to the first and second signal paths illustrated in the current sense amplifier systems illustrated in FIGS. 3-4 and 6-7 of this disclosure. The first signal path may include a first passive R-C filter 502 and the second signal path may include a second passive R-C filter 504. The first passive R-C filter 502 and the second passive R-C filter may be configured to band limit the common mode signal present at the inputs of amplifier 512.

Figure 6:
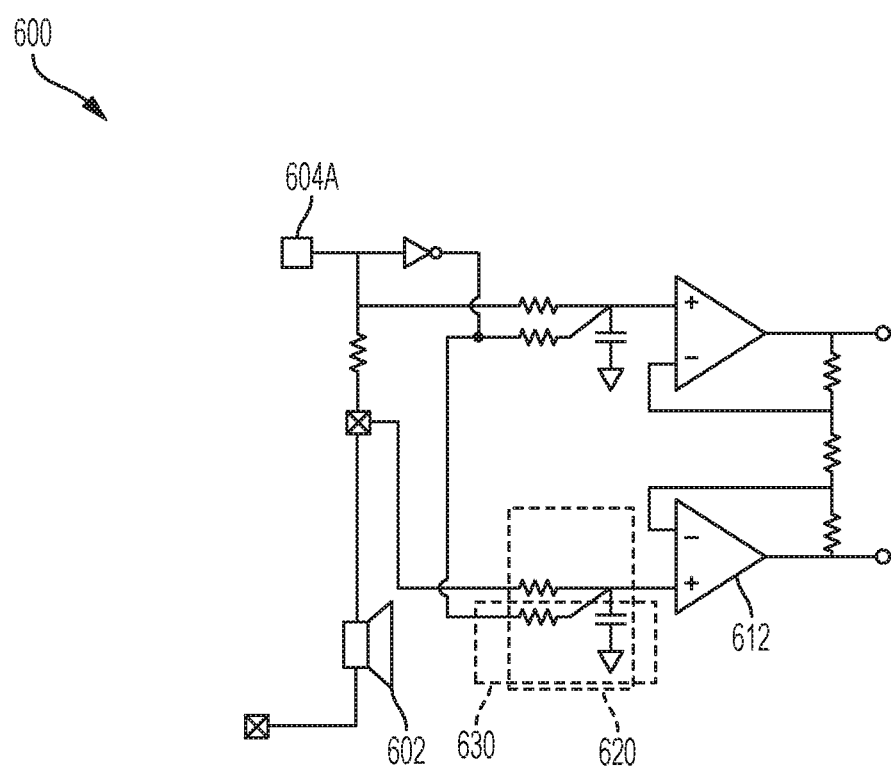
FIG. 6 is another example schematic block diagram illustrating passive R-C filtering in a current sense amplifier according to one embodiment of the disclosure.

FIG. 6 is another example schematic block diagram illustrating passive R-C filtering in a current sense amplifier system according to one embodiment of the disclosure. FIG. 6 illustrates additional R-C filtering that may be implemented in conjunction with or as an alternative to the passive R-C filtering illustrated in FIG. 5. For example, a current sense amplifier system 600 may include a second amplifier 612 coupled to device 602, a third signal path from device 602 to second amplifier 612 that includes a third passive R-C filter 620, and a fourth signal path from a first input terminal 604A to second amplifier 612 that includes a fourth passive R-C filter 630. Similar to the passive R-C filtering illustrated in FIG. 5, the passive R-C filtering illustrated in FIG. 6 may be configured to further band limit the common mode signal present at the inputs of the amplifiers illustrated in FIG. 6.

Figure 7:
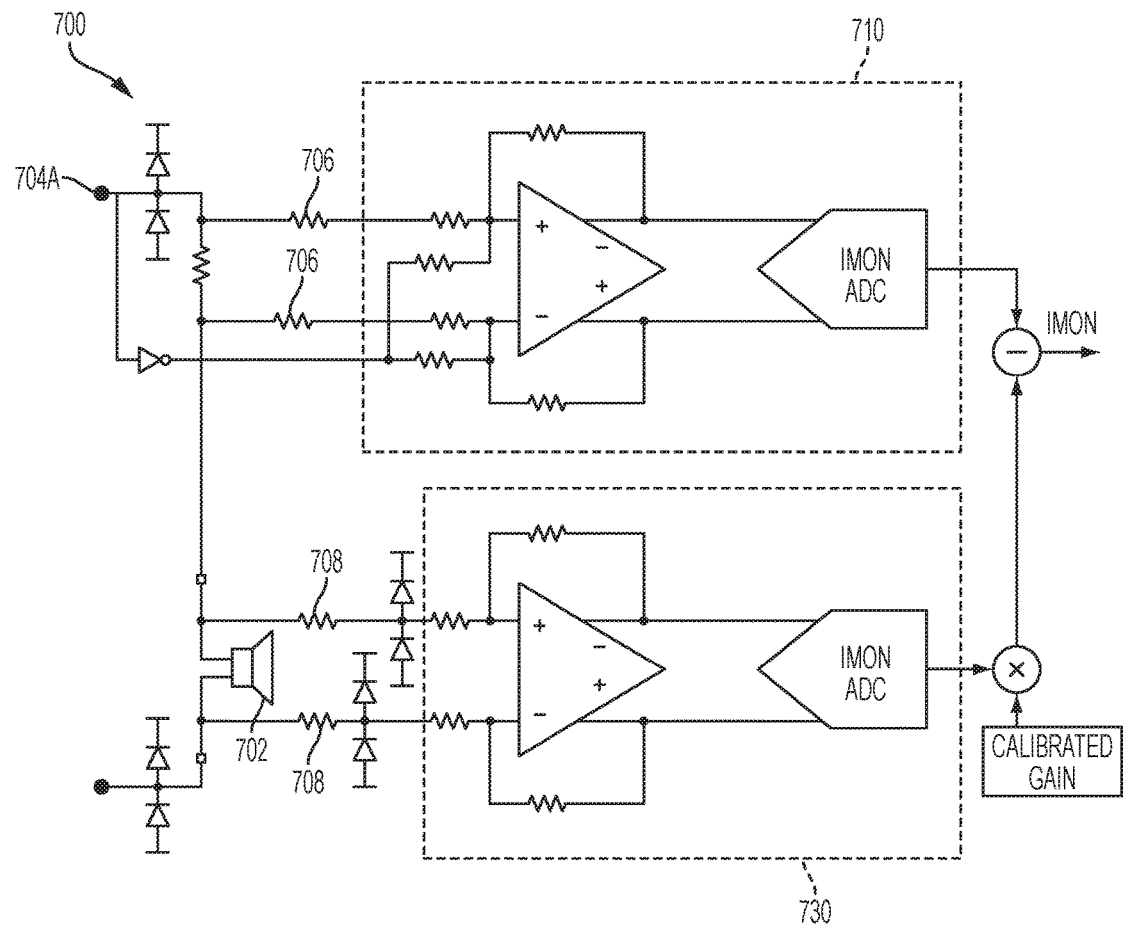
FIG. 7 is an example schematic block diagram illustrating attenuation of voltage signals in a current sense amplifier system according to one embodiment of the disclosure.

FIG. 7 is an example schematic block diagram illustrating attenuation of voltage signals in a current sense amplifier system according to one embodiment of the disclosure. Current sense amplifier system 700 illustrates the use of external resistors to attenuate voltage signals near pads to increase linearity in the ADC paths of the current sense amplifier system 700. Current sense amplifier system 700 may include a first external resistor 706 coupled between a first ADC path 710 and a first input terminal 704A of system 700. Current sense amplifier system 700 may also include a second external resistor 708 coupled between second ADC path 730 and device 702. The first external resistor 706 and the second external resistor 708 may be configured to increase linearity of the first ADC path 710 and the second ADC path 730, respectively.

Figure 8:
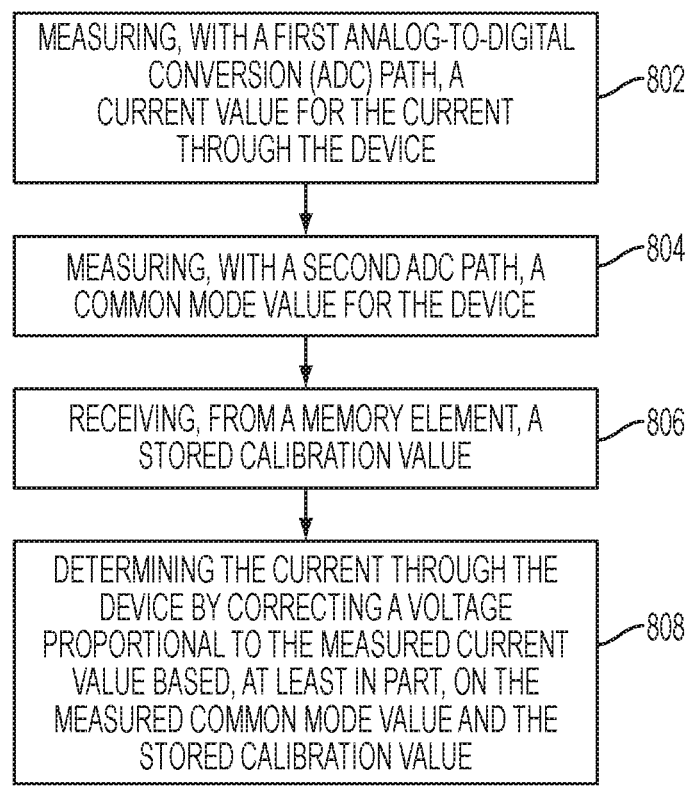
FIG. 8 is an example flow chart illustrating a method for measuring a current through a device according to one embodiment of the disclosure.

FIG. 8 is an example flow chart illustrating a method for measuring a current through a device according to one embodiment of the disclosure. Method 800 may be implemented with the systems described with respect to FIGS. 2-7. Method 800 includes, at block 802, measuring, with a first ADC path, a current value for the current through the device. In addition, method 800 includes, at block 804, measuring, with a second ADC path, a common mode value for the device. According to an embodiment, the first ADC path may have a dynamic range that is larger than a dynamic range of the second ADC path. In addition, in some embodiments, phase equalization may be performed in the second ADC path.

In some embodiments, a sense resistor in series with the device may be used in conjunction with the first ADC path to measure the current value. Thus, in one embodiment, measuring the current value may include sensing, with an amplifier, a voltage proportional to a current through the sense resistor. According to an embodiment, the voltage across the sense resistor generated based on the measured current through the device may include a small signal voltage having an amplitude smaller than the common mode value present on each node of the sense resistor. An ADC may be used to convert the analog signal at the output of the amplifier to a digital signal for determining the current.

Method 800 then includes, at block 806, receiving, from a memory element, a stored calibration value. Further, method 800 includes, at block 808, determining the current through the device by correcting a voltage proportional to the measured current value based, at least in part, on the measured common mode value and the stored calibration value. In some embodiments, the step of correcting the voltage proportional to the measured current value may include correcting for a resistor mismatch in the first ADC path.

According to one embodiment, speaker protection may be performed by a current sense amplifier system implementing method 800 based, at least in part, on the determined current through the device. In another embodiment, speaker linearization may be performed based, at least in part, on the determined current through the device. In yet another embodiment, haptic feedback may be provided based, at least in part, on the determined current through the device.

Figure 9:
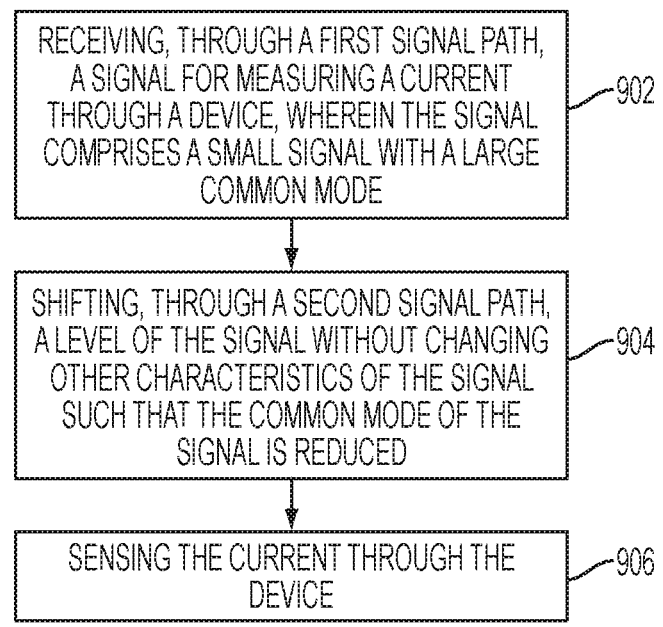
FIG. 9 is an example flow chart illustrating another method for measuring a current through a device according to one embodiment of the disclosure.

FIG. 9 is an example flow chart illustrating another method for measuring a current through a device according to one embodiment of the disclosure. Method 900 may be implemented with the systems described with respect to FIGS. 2-7. Method 900 includes, at block 902, receiving, through a first signal path, a signal for measuring a current through a device, wherein the signal comprises a small signal with a large common mode. At block 904, method 900 includes shifting, through a second signal path, a level of the signal without changing other characteristics of the signal such that the common mode of the signal is reduced. At block 906, method 900 includes sensing the current through the device, such as a transducer. In some embodiments, shifting the level through the second signal path may include inverting the signal. In addition, correcting the voltage proportional to the sensed current value may include correcting for a resistor mismatch in the first ADC path.

According to an embodiment, the common mode signal may be intentionally band limited by a current sense amplifier system implementing method 900. For example, receiving the signal through the first signal path may include filtering the signal with a first passive R-C filter. Similarly, passive R-C filtering may also be applied in the second signal path with a second passive R-C filter. As noted above, the first passive R-C filter and the second passive R-C filter may be configured to band limit the common mode signal.

In some embodiments, receiving the signal and shifting the level of the signal may be performed in a first ADC path. In a second ADC path, monitoring of a common mode value for the device may be performed. In addition, a stored calibration value may be received from a memory element. According to some embodiments, a voltage proportional to the sensed current may be corrected based on the measured common mode value and the stored calibration value. The voltage being corrected may be a voltage generated based on the sensed current through the device and may include a small signal voltage in addition to a common mode voltage, with the small signal voltage having an amplitude smaller than the common mode value.

The schematic flow chart diagrams of FIGS. 8 and 9 are generally set forth as a logical flow chart diagrams. As such, the depicted order and labeled steps are indicative of aspects of the disclosed methods. Other steps and methods may be conceived that are equivalent in function, logic, or effect to one or more steps, or portions thereof, of the illustrated methods. Additionally, the format and symbols employed are provided to explain the logical steps of the methods and are understood not to limit the scope of the methods. Although various arrow types and line types may be employed in the flow chart diagram, they are understood not to limit the scope of the corresponding methods. Indeed, some arrows or other connectors may be used to indicate only the logical flow of the methods. For instance, an arrow may indicate a waiting or monitoring period of unspecified duration between enumerated steps of the depicted methods. Additionally, the order in which a particular method occurs may or may not strictly adhere to the order of the corresponding steps shown.

If implemented in firmware and/or software, functions described above may be stored as one or more instructions or code on a computer-readable medium. Examples include non-transitory computer-readable media encoded with a data structure and computer-readable media encoded with a computer program. Computer-readable media includes physical computer storage media. A storage medium may be any available medium that can be accessed by a computer. By way of example, and not limitation, such computer-readable media can comprise random access memory (RAM), read-only memory (ROM), electrically-erasable programmable read-only memory (EEPROM), compact disc read-only memory (CD-ROM) or other optical disk storage, magnetic disk storage or other magnetic storage devices, or any other medium that can be used to store desired program code in the form of instructions or data structures and that can be accessed by a computer. Disk and disc includes compact discs (CD), laser discs, optical discs, digital versatile discs (DVD), floppy disks and Blu-ray discs. Generally, disks reproduce data magnetically, and discs reproduce data optically. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and certain representative advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. For example, although current sense amplifier systems are described throughout the detailed description, aspects of the invention may be applied to the design of other devices that include differential amplifiers. As one of ordinary skill in the art will readily appreciate from the present disclosure, processes, machines, manufacture, compositions of matter, means, methods, or steps, presently existing or later to be developed that perform substantially the same function or achieve substantially the same result as the corresponding embodiments described herein may be utilized. Accordingly, the appended claims are intended to include within their scope such processes, machines, manufacture, compositions of matter, means, methods, or steps.

What is claimed is:

1. An apparatus for measuring a current through a device, comprising:
    a first analog-to-digital conversion (ADC) path coupled to the device and configured to measure a current value;
    a second ADC path coupled to the device and configured to measure a common mode value;
    a memory element comprising a stored calibration value; and
    a summer block coupled to the first ADC path, the second ADC path, and the memory element, wherein the summer block is configured to output a voltage proportional to the measured current through the device by correcting a voltage value output by the first ADC path based, at least in part, on the measured common mode value of the second ADC path and the stored calibration value.

2. The apparatus of claim 1, wherein a voltage across a sense resistor generated based, at least in part, on the measured current through the device comprises a small signal voltage having an amplitude smaller than the common mode value present on each node of the sense resistor.

3. The apparatus of claim 1, wherein the first ADC path comprises:
    an amplifier coupled to a sense resistor, wherein the sense resistor is in series with the device; and
    an ADC coupled to an output of the amplifier and configured to provide a digital value representative of the measured current value to the summer block.

4. The apparatus of claim 3, wherein the first ADC path further comprises:
    a first resistor coupled between the sense resistor and a first input node of the amplifier; and
    a second resistor having a second resistance value approximately equal to a first resistance value of the first resistor, wherein the second resistor is coupled between the sense resistor and a second input node of the amplifier,
    wherein a modified common mode value generated by the multiplication of a voltage proportional to the measured common mode value and the stored calibration value is subtracted from an output of the first ADC path by the summer block to compensate for a mismatch between the first resistance value and the second resistance value.

5. The apparatus of claim 4, wherein the second ADC path further comprises a phase equalization filter coupled between the ADC and the summer block.

6. The apparatus of claim 4, wherein an ADC of the second ADC path is configured with a dynamic range that is smaller than a dynamic range of a second analog-to-digital converter (ADC) of the first ADC path.

7. The apparatus of claim 4, wherein the second ADC path comprises at least one component configured to perform voltage monitoring within the apparatus.

8. The apparatus of claim 1, wherein the second ADC path comprises:
an amplifier block coupled to the device; and
an ADC coupled to an output of the amplifier and configured to provide a digital value for the measured common mode to the summer block.

9. The apparatus of claim 1, wherein the device comprises a transducer and an output of the summer block is coupled to a speaker protection circuit.

10. The apparatus of claim 1, wherein the device comprises a transducer and an output of the summer block is coupled to a speaker linearization circuit.

11. The apparatus of claim 1, wherein the device comprises a haptic feedback device and an output of the summer block is coupled to a haptic control circuit.

12. A method for measuring a current through a device, comprising:
measuring, with a first analog-to-digital conversion (ADC) path, a current value for the current through the device;
measuring, with a second ADC path, a common mode value for the device;
receiving, from a memory element, a stored calibration value; and
determining the current through the device by correcting a voltage proportional to the measured current value based, at least in part, on the measured common mode value and the stored calibration value.

13. The method of claim 12, wherein a voltage across a sense resistor generated based, at least in part, on the measured current through the device comprises a small signal voltage having an amplitude smaller than the common mode value present on each node of the sense resistor.

14. The method of claim 12, wherein the step of measuring the current value comprises:
sensing a voltage proportional to a current through a sense resistor in series with the device with an amplifier; and
converting an analog signal at an output of the amplifier to a digital signal for determining the current.

15. The method of claim 12, wherein the step of correcting the voltage proportional to the measured current value comprises correcting for a resistor mismatch in the first ADC path.

16. The method of claim 12, further comprising performing a phase equalization in the second ADC path.

17. The method of claim 12, wherein the first ADC path has a dynamic range that is larger than a dynamic range of the second ADC path.

18. The method of claim 12, further comprising performing speaker protection based, at least in part, on the determined current through the device.

19. The method of claim 12, further comprising performing speaker linearization based, at least in part, on the determined current through the device.

20. The method of claim 12, further comprising providing haptic feedback based, at least in part, on the determined current through the device.

21. A mobile device, comprising:
a transducer;
a controller integrated circuit (IC) coupled to the transducer, wherein the controller IC is configured to measure a current through the transducer, the controller IC comprising:
a first analog-to-digital conversion (ADC) path coupled to the device and configured to measure a current value;
a second ADC path coupled to the device and configured to measure a common mode value;
a memory element comprising a stored calibration value; and
a summer block coupled to the first ADC path, the second ADC path, and the memory element, wherein the summer block is configured to output a voltage proportional to the measured current through the device by correcting a voltage value output by the first ADC path based, at least in part, on the measured common mode value and the stored calibration value.

22. The apparatus of claim 21, wherein the first ADC path comprises:
an amplifier coupled to a sense resistor in series with the device; and
an ADC coupled to an output of the amplifier and configured to provide a digital value to the summer block.

23. The apparatus of claim 22, wherein the first ADC path further comprises:
a first resistor coupled between the sense resistor and a first input node of the amplifier;
a second resistor having a second resistance value approximately equal to a first resistance value of the first resistor, wherein the second resistor is coupled between the sense resistor and a second input node of the amplifier,
wherein a modified common mode value generated by the multiplication of a voltage proportional to the measured common mode value and the stored calibration value is subtracted from an output of the first ADC path by the summer block to compensate for a mismatch between the first resistance value and the second resistance value.

24. The apparatus of claim 21, wherein an ADC of the second ADC path is configured with a dynamic range that is smaller than a dynamic range of an ADC of the first ADC path.

25. The apparatus of claim 21, wherein the controller IC is further configured to perform speaker protection based, at least in part, on the measured current through the transducer.

26. The apparatus of claim 21, wherein the controller IC is further configured to perform speaker linearization based, at least in part, on the measured current through the transducer.

* * * * *